United States Patent
Miyanishi et al.

(10) Patent No.: US 7,105,901 B1
(45) Date of Patent: Sep. 12, 2006

(54) SEMICONDUCTOR DEVICE

(75) Inventors: Atsushi Miyanishi, Tokyo (JP); Hisashi Matsumoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/114,203

(22) Filed: Jul. 13, 1998

(30) Foreign Application Priority Data

Jan. 29, 1998 (JP) ............................... P10-017011

(51) Int. Cl.
*H01L 29/78* (2006.01)

(52) U.S. Cl. ........................................ 257/401; 257/394

(58) Field of Classification Search ................ 257/775, 257/394, 401, 365, 372, 773, 202, 204–211, 257/909

See application file for complete search history.

(56) References Cited

U.S. PATENT DOCUMENTS

| 5,148,244 A | * | 9/1992 | Iwasaki | 357/22 |
| 5,164,811 A | * | 11/1992 | Tamura | 257/206 |
| 5,496,754 A | * | 3/1996 | Bergemont et al. | 437/43 |
| 5,576,560 A | * | 11/1996 | Runaldue et al. | 257/208 |
| 5,668,389 A | * | 9/1997 | Jassowski et al. | 257/207 |
| 5,811,859 A | * | 9/1998 | Shou et al. | 257/369 |

FOREIGN PATENT DOCUMENTS

| JP | 61-27674 | 2/1986 |
| JP | 2-12823 | 1/1990 |
| JP | 5-13449 | 1/1993 |
| JP | 9-23009 | 1/1997 |
| WO | WO 94/29898 | * 12/1994 |

* cited by examiner

*Primary Examiner*—Jerome Jackson
(74) *Attorney, Agent, or Firm*—Buchanan Ingersoll & Rooney, PC

(57) ABSTRACT

An active area (1) is provided with a concave part in its corner portion in a shape along a plan view. An insulating film (7) encloses this active area. A gate electrode (30) is arranged on a depressed region (DR) having an edge portion which is located on a low position due to the concave part, while a gate electrode (20) is arranged on an ordinary region (OR) having an edge portion projecting beyond the depressed region. A gate end cap (margin part) of the gate electrode (20) has a length x, while that of the gate electrode (30) has a length x+α. Thus provided is a semiconductor device causing no current defect between source/drain regions even if the active area and an insulating film defining this active area fail to satisfy the layout design following refinement of the semiconductor device.

12 Claims, 13 Drawing Sheets

SEMICONDUCTOR DEVICE

BACKGROUND OF THE INVENTION

1. Field of the Invention

The present invention relates to a semiconductor device, and more particularly, it relates to the shape of a margin part of a gate electrode forming a MOS transistor which is provided on an active area having a concave part.

2. Description of the Background Art

A semiconductor device formed by MOS transistors is generally provided with an insulating film which is formed to enclose an active area (element forming region) for electrically isolating this active area from other ones. The gate electrode of each MOS transistor provided on the active area is formed over the active area and the insulating film to divide the active area, thereby electrically isolating source/drain regions formed on both sides of the gate electrode from each other.

FIG. 29 shows a part of an active area and gate electrodes which are formed on this active area. Referring to FIG. 29, the active area 1 has a concave part on its corner portion in a shape along a plan view. In other words, the concave part partially reduces the width of the active area 1. An insulating film 7 encloses the active area 1. The gate electrode 3 is so formed that its end portion reaches an upper portion of the insulating film 7 on the concave part, while the gate electrode 2 is so formed that its end portion reaches an upper portion of the insulating film 7 in a portion other than the concave part.

The parts of the gate electrodes 2 and 3 reaching the upper portion of the insulating film 7 are referred to as gate end caps, and x represents the length thereof. The gate end caps are set as margin parts (gate parts extending beyond the active area 1) in the layout design phase so that the length of the gate electrodes 2 and 3 are not smaller than the span of the active area 1, and the length x thereof is uniformly set for all gate electrodes as that from an edge portion of the active area 1 on design. This length x is so set that the forward end portions of the gate electrodes 2 and 3 are not located on the active area 1 even if the same are rounded due to corrosion by etching or the like to partially reduce the gate length. Source/drain regions SDA and SDB are formed on both sides of the gate electrode 3. While still another source/drain region is formed on a side of the gate electrode 2, symbol therefor is omitted in FIG. 29.

Such a gate end cap is defined as a part between an endmost portion of each gate electrode and an edge portion of the active area. When two active areas are formed separately from each other and a single gate electrode is formed to extend over these two active areas, therefore, the gate electrode is provided on an insulating film between the two active areas. However, no gate end cap is present on this portion, due to absence of an end portion of the gate electrode.

While such a gate electrode has an end portion on its pad part provided with a contact hole or a via hole or directly connected to a wiring layer, no gate end cap is present on (required for) this part.

The active area 1 has a concave part when provided with an AND-NOR gate C10 shown in FIG. 30, for example. Referring to FIG. 30, an AND part C1 is supplied with input signals I1 and I2, while a second input of a NOR part C2 is supplied with an input signal I3.

FIG. 31 shows the transistor level structure of the AND-NOR gate C10. The AND-NOR gate C10 comprises P-channel transistors Q1 and Q2 having source electrodes which are connected to a power source VDD in common, a PMOS transistor Q3 having a source electrode which is connected to drain electrodes of the P-channel transistors Q1 and Q2, NMOS transistors Q4 and Q6 having drain electrodes which are connected to that of the PMOS transistor Q3 in common, and an NMOS transistor Q5 having a drain electrode which is connected to a source electrode of the NMOS transistor Q4 and a source electrode which is grounded in common with that of the NMOS transistor Q6. The input signals I1 and I2 are supplied to gate electrodes G1, G2, G4 and G5 of the PMOS transistors Q1 and Q2 and the NMOS transistors Q4 and Q5, while the input signal I3 is supplied to gate electrodes G3 and G6 of the PMOS transistor Q3 and the NMOS transistor Q6. A common node between the PMOS transistor Q3 and the NMOS transistors Q4 and Q6 defines an output end.

FIG. 32 illustrates the layout of the NMOS transistors Q4 to Q6 of the AND-NOR gate C10 having such a structure.

Referring to FIG. 32, an active area AR is provided with a concave part on its corner portion in a shape along a plan view, and an insulating film IF encloses this active area AR. The gate electrode G6 is formed on a depressed region DR having a span which is reduced due to the concave part, while the gate electrodes G4 and G5 are formed on an ordinary region OR other than the concave part.

FIG. 33 is a sectional view taken along the line A—A in FIG. 29. As shown in FIG. 33, the gate electrode 3 formed on the active area 1 extends on the upper portion of the insulating film 7 over the length x of the gate end cap. Therefore, the source/drain regions SDA and SDB are electrically isolated from each other. While the active area 1 is invisible in the sectional direction since a channel region is formed on a portion of a silicon substrate 8 located under the gate electrode 3, FIG. 33 shows the position corresponding to the active area 1 with a broken line for convenience of illustration.

While the source/drain regions SDA and SDB are generally electrically isolated from each other regardless of the concave part of the active area 1, such source/drain regions SDA and SDB may not be completely isolated from each other, depending on the shape of the concave part.

This case is now described with reference to FIGS. 34 and 35. FIG. 34 shows an active area 1A having a corner portion which is provided with no concave part but obliquely notched. FIG. 36 is a sectional view taken along the line A—A in FIG. 34. As shown in FIG. 36, a gate electrode 3 does not reach an upper portion of an insulating film 7, and the active area 1A is longer than the gate electrode 3.

When gate electrodes 2 and 3 similar to those shown in FIG. 29 are formed on this active area 1A having such a shape, an end portion of the gate electrode 3 does not reach the upper portion of the insulating film 7. Source/drain regions are generally formed by injecting an impurity through a gate electrode serving as an injection mask. If an impurity is injected through the gate electrode 3 serving as an injection mask, therefore, source/drain regions SDA and SDB are formed not only on both sides of the gate electrode 3 but also around a forward end portion thereof. Consequently, the source/drain regions SDA and SDB formed on both sides of the gate electrode 3 are electrically shorted to hinder the function of the MOS transistor.

FIG. 35 shows an active area 1B provided on its corner portion with a concave part, which is not rectangularly shaped.

When gate electrodes 2 and 3 similar to those shown in FIG. 29 are formed on this active area 1B having such a shape, an end portion of the gate electrode 3 only partially reaches an upper portion of an insulating film 7. In this case, source/drain regions SDA and SDB formed on both sides of the gate electrode 3 are not electrically shorted but the gate length of the gate electrode 3 is partially reduced. Assuming that L represents the gate length of the gate electrode 3 and b represents the length of a part of the end portion of the gate electrode 3 not reaching the upper portion of the insulating film 7 as shown in FIG. 35, the substantial gate length is about L–b. When the gate length is thus partially reduced, a leakage current flows between the source/drain regions SDA and SDB in a transistor operation to deteriorate the function of the MOS transistor. FIG. 37 shows a gate electrode 3 having a forward end portion which is rounded due to corrosion by etching or the like. As shown in FIG. 37, both side surfaces of the gate electrode 3 only partially reach an upper portion of an insulating film 7 due to the rounded forward end portion. Assuming that b and c represent the lengths of such parts respectively, the substantial gate length is about L–b–c. Thus, the substantial gate length is further reduced as compared with a gate electrode having a forward end portion which is not rounded.

Formation of the active area 1A or 1B shown in FIG. 34 or 35 conceivably results from divergence of the insulating film from the layout design, an proximity effect in photolithography, displacement of the position for introducing the impurity from the planned one in formation of the source/drain regions SDA and SDB. It can be said that such a problem, which has become obvious following refinement of the semiconductor device, has heretofore been neglected.

SUMMARY OF THE INVENTION

According to a first aspect of the present invention, a semiconductor device comprises an active area which is provided with at least one MOS transistor and an insulating film defining the active area. The active area is set in a shape having a concave part in a shape along a plan view, the active area is provided with an ordinary region and a depressed region having an edge portion which is depressed beyond the ordinary region due to presence of the concave part, the MOS transistor includes a first MOS transistor which is formed on the depressed region and a second MOS transistor which is formed on the ordinary region, and the length of a margin part of a first gate electrode constructing the first MOS transistor is set to be larger than that of a margin part of a second gate electrode constructing the second MOS transistor.

In the semiconductor device according to the first aspect of the present invention, the length of the margin part of the first gate electrode forming the first MOS transistor is set to be larger than that of the margin part of the second gate electrode forming the second MOS transistor, whereby an end portion of the first gate electrode completely reaches an upper portion of the insulating film even if an unnecessary active area exists in the concave part of the active area after various fabrication steps. Thus, the first gate electrode is prevented from partial reduction of its gate length, thereby preventing occurrence of current leakage between source/drain regions which are formed on the exterior of both side surfaces of the first gate electrode. Even if the concave part is filled up with an unnecessary active area, further, the source/drain regions formed on the exterior of both side surfaces of the first gate electrode are electrically isolated from each other and prevented from shorting, whereby a normally operating MOS transistor can be obtained.

According to a second aspect of the present invention, the concave part is formed on a corner portion of the active area, and the length of the margin part of the first gate electrode is set at the total of the length of the margin part of the second gate electrode and a length which is equal to a depression length in the concave part.

In the semiconductor device according to the second aspect of the present invention, the margin part of the first gate electrode has a sufficient length, whereby the end portion of the first gate electrode completely reaches the upper portion of the insulating film even if the corner portion of the active area is provided with no concave part but obliquely notched after various fabrication steps, whereby the source/drain regions formed on the exterior of both side surfaces of the first gate electrode are electrically isolated from each other and prevented from shorting, whereby a normally operating MOS transistor can be obtained.

According to a third aspect of the present invention, the concave part is formed on a corner portion of the active area, and the length of the margin part of the first gate electrode is set at the total of the length of the margin part of the second gate electrode and the length of a portion between the edge portion of the depressed region and an intersection between a virtual line which is set to connect first and second convex corner portions of the active area in the concave part and the first gate electrode.

In the semiconductor device according to the third aspect of the present invention, the length of the margin part of the first gate electrode is set on the assumption that the corner portion of the active area is provided with no concave part but obliquely notched. Even if the corner portion of the active area is provided with no concave part but obliquely notched after various fabrication steps, therefore, the end portion of the first gate electrode completely reaches the upper portion of the insulating film, whereby the source/drain regions formed on the exterior of both side surfaces of the first gate electrode are electrically isolated from each other and prevented from shorting, whereby a normally operating MOS transistor can be obtained. Further, the length of the margin part of the first gate electrode is prevented from being increased beyond necessity.

According to a fourth aspect of the present invention, the concave part is a dent part which is formed on a portion of the active area other than the corner portion, the ordinary region is divided into first and second ordinary regions due to presence of the dent part, an edge portion of the second ordinary region is on a position depressed beyond that of the first ordinary region, and the length of the margin part of the first gate electrode is set at the total of the length of the margin part of the second gate electrode and a length which is equal to a depression length of the edge portions of the depressed region and the second ordinary region.

In the semiconductor device according to the fourth aspect of the present invention, the margin part of the first gate electrode has a sufficient length, whereby the end portion of the first gate electrode completely reaches the upper portion of the insulating film even if an unnecessary active area exists in the concave part of the active area after various fabrication steps, whereby the first gate electrode is prevented from partial reduction of its gate length. Therefore, occurrence of current leakage between the source/drain regions formed on the exterior of both side surfaces of the first gate electrode is prevented, whereby a normally operating MOS transistor can be obtained.

According to a fifth aspect of the present invention, the concave part is a dent part which is formed on a portion of the active area other than the corner portion, the ordinary region is divided into first and second ordinary regions due to presence of the dent part, an edge portion of the second ordinary region is on a position depressed beyond that of the first ordinary region, and the length of the margin part of the first gate electrode is set at the total of the length of the margin part of the second gate electrode and the length of a portion between the edge portion of the depressed region and an intersection between a virtual line which is set to connect first and second convex corner portions of the active area in the concave part and the first gate electrode.

In the semiconductor device according to the fifth aspect of the present invention, the length of the margin part of the first gate electrode is set on the assumption that the concave part is filled up with an unnecessary active area, whereby the length of the margin part of the first gate electrode is prevented from being increased beyond necessity.

According to a sixth aspect of the present invention, a semiconductor device comprises an active area which is provided with at least one MOS transistor, and an insulating film defining the active area. The active area is set in a shape having a concave part in a shape along a plan view, the active area is provided with an ordinary region and a depressed region having an edge portion which is depressed beyond the ordinary region due to presence of the concave part, the MOS transistor includes a first MOS transistor which is formed on the depressed region and a second MOS transistor which is formed on the ordinary region, and a margin part of a first gate electrode constructing the first MOS transistor is set in a shape having a bent portion which is bent at a prescribed angle to extend in a direction separating from the ordinary region.

In the semiconductor device according to the sixth aspect of the present invention, the margin part of the first gate electrode forming the first MOS transistor is set in the shape having the bent portion which is bent at the prescribed angle to extend in the direction separating from the ordinary region, whereby the end portion of the first gate electrode completely reaches the upper portion of the insulating film even if an unnecessary active area exists in the concave part of the active area after various fabrication steps. Thus, the first gate electrode is prevented from partial reduction of its gate length, and occurrence of current leakage between the source/drain regions formed on the exterior of both side surfaces of the first gate electrode is prevented. Even if the concave part is filled up with an unnecessary active area, the source/drain regions formed on the exterior of both side surfaces of the first gate electrode are electrically isolated from each other and prevented from shorting, whereby a normally operating MOS transistor can be obtained.

According to a seventh aspect of the present invention, the concave part is formed on a corner portion of the active area, the prescribed angle is 90°, the depressed region includes a first edge portion which is perpendicular to the first gate electrode and a second edge portion which is parallel to the first gate electrode, the bent portion extends to be substantially in contact with or not in contact with the first edge portion of the depressed region, and the length of the bent portion is so set that its forward end portion projects beyond the second edge portion of the depressed region by a distance which is equal to the length of a margin part of a second gate electrode constructing the second MOS transistor.

In the semiconductor device according to the seventh aspect of the present invention, the forward end portion of the bent portion is set to project beyond the second edge portion of the depressed region, whereby the end portion of the first gate electrode completely reaches the upper portion of the insulating film even if an unnecessary active area exists in the concave part of the active area after various fabrication steps, whereby the first gate electrode is prevented from partial reduction of its gate length, occurrence of current leakage between the source/drain regions formed on the exterior of both side surfaces of the first gate electrode is prevented, and a normally operating MOS transistor can be obtained.

According to an eighth aspect of the present invention, the concave part is formed on a corner portion of the active area, the prescribed angle is 90°, the depressed region includes a first edge portion which is perpendicular to the first gate electrode and a second edge portion which is parallel to the first gate electrode, the bent portion extends to be not in contact with the first edge portion of the depressed region, and the length of the bent portion is so set that its forward end portion projects beyond an intersect position between a virtual line which is set to connect first and second convex corner portions of the active area in the concave part and the first gate electrode by a distance which is equal to the length of a margin part of a second gate electrode constructing the second MOS transistor.

In the semiconductor device according to the eighth aspect of the present invention, the length of the margin part of the first gate electrode is set on the assumption that the corner portion of the active area is provided with no concave part but obliquely notched. Even if the corner portion is provided with no concave part but obliquely notched after various fabrication steps, therefore, the end portion of the first gate electrode completely reaches the upper portion of the insulating film. Thus, the source/drain regions formed on the exterior of both side surfaces of the first gate electrode are electrically isolated from each other and prevented from shorting, whereby a normally operating MOS transistor can be obtained. Further, the length of the margin part of the first gate electrode is prevented from being increased beyond necessity.

According to a ninth aspect of the present invention, the concave part is formed on a corner portion of the active area, the bent portion is bent about an intersect position between a virtual line which is set to connect first and second convex corner portions of the active area in the concave part and the first gate electrode, the prescribed angle is smaller than 90°, and the length of the bent portion is so set that its forward end portion projects beyond the intersect position by a distance which is equal to the length of a margin part of a second gate electrode constructing the second MOS transistor.

In the semiconductor device according to the ninth aspect of the present invention, the forward end portion of the bent portion is set to project beyond the intersect position between the first gate electrode and the virtual line, whereby the end portion of the first gate electrode completely reaches the upper portion of the insulating film even if the corner portion of the active area is provided with no concave part but obliquely notched after various fabrication steps. Thus, the source/drain regions formed on the exterior or both side surfaces of the first gate electrode are electrically isolated from each other and prevented from shorting, whereby a normally operating MOS transistor can be obtained.

According to a tenth aspect of the present invention, a semiconductor device comprises an active area which is provided with at least one MOS transistor and an insulating film defining the active area. The active area is set in a shape having a concave part in a shape along a plan view, the active area is provided with an ordinary region and a depressed region having an edge portion which is depressed beyond the ordinary region due to presence of the concave part, the MOS transistor includes a plurality of MOS transistors which are arranged on the depressed region and electrically connected in parallel with each other, and respective gate electrodes of the plurality of MOS transistors are arranged in parallel with each other and electrically connected in common so that margin parts of at least a gate electrode which is located most approximately to the ordinary region and that adjacent to this gate electrode are connected with each other among the respective gate electrodes of the plurality of MOS transistors.

In the semiconductor device according to the tenth aspect of the present invention, the margin parts of at least the gate electrode located most approximately to the ordinary region and the gate electrode adjacent thereto are connected with each other among the respective gate electrodes of the plurality of MOS transistors when the plurality of MOS transistors which are electrically connected in parallel with each other are arranged on the depressed region, whereby the two gate electrodes and a connected body of the respective margin parts enclose the source/drain regions between the two gate electrodes. Even if an unnecessary active area exists in the concave part of the active area after various fabrication steps, therefore, the source/drain regions between the two gate electrodes are electrically isolated from the remaining source/drain regions and prevented from shorting, whereby normally operating MOS transistors can be obtained.

According to an eleventh aspect of the present invention, all margin parts of the respective gate electrodes of the plurality of MOS transistors are connected with each other.

In the semiconductor device according to the eleventh aspect of the present invention, all margin parts of the respective gate electrodes of the plurality of MOS transistors are connected when the plurality of MOS transistors which are electrically connected in parallel with each other are arranged on the depressed region. Even if an unnecessary active area exists in the concave part of the active area over a wide range, therefore, the source/drain regions between the gate electrodes are electrically isolated from each other and prevented from shorting, whereby normally operating MOS transistors can be obtained.

An object of the present invention is to provide a semiconductor device which causes no current defect between source/drain regions even if an active area and an insulating film defining this active area fail to satisfy the layout design following refinement of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A. Embodiment 1

<A-1. Device Structure>

Figure 1:
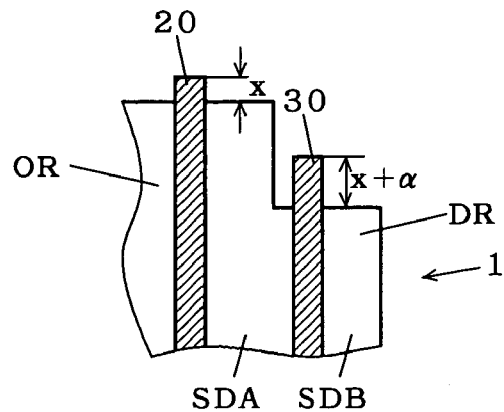
FIG. 1 illustrates a semiconductor device according to an embodiment 1 of the present invention.

FIG. 1 shows a part of an active area 1 in the layout design phase of a semiconductor device according to an embodiment 1 of the present invention and gate electrodes 20 and 30 arranged on this active area 1. Referring to FIG. 1, the active area 1 is provided with a concave part on its corner portion in a shape along a plan view. An insulating film 7 encloses the active area 1. The gate electrode 30 is arranged on a depressed region DR having an edge portion which is located on a low position due to the concave part, and the gate electrode 20 is arranged on an ordinary region (a region other than the depressed region DR) OR having an edge portion projecting beyond the depressed region DR.

A gate end cap (margin part) of the gate electrode has a length x. This gate end cap is set as the margin part (gate portion extending beyond the active area) in order to prevent the length of the gate electrode from being reduced below the span of the active area. The length x is so set that a forward portion of the gate electrode is not located on the active area even if this forward end portion is rounded due to corrosion by etching or the like to partially reduce the gate length. The length x of the gate end cap of the gate electrode 20 is set as that from an edge portion of the active area on layout design.

On the other hand, a gate end cap of the gate electrode 30 has a length x+α. The additional length a is set to be not more than the length x of the gate end cap of the gate electrode arranged on the ordinary region (0<α≦x), for example.

<A-2. Characteristic Function/Effect>

Figure 2:
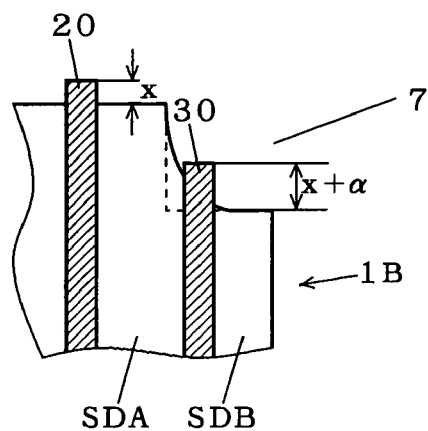
FIG. 2 illustrates the semiconductor device according to the embodiment 1 of the present invention.

FIG. 2 shows a part of an active area 1B of a semiconductor device actually fabricated on the basis of such design values and gate electrodes 20 and 30 arranged on this active area 1B. Referring to FIG. 2, the active area 1B is provided on its corner portion with a concave part, which is not rectangularly shaped. Such an active area 1B results from accumulation of subtle divergence of actual values from design values in various fabrication steps for forming an insulating film 7, source/drain regions SDA and SDB and the like, and it is not easy to thoroughly this problem. However, a gate end cap of the gate electrode 30 is set at the length x+α as hereinabove described, whereby an end portion of the gate electrode 30 completely reaches an upper portion of the insulating film 7 for preventing partial reduction of the gate length even if an unnecessary active area exists in the concave part of the active area 1B. Thus, the source/drain regions SDA and SDB are prevented from occurrence of current leakage therebetween, whereby the function of the MOS transistor can be maintained. If no problem arises in the fabrication process but the concave part is rectangularly shaped, a semiconductor device similar to that shown in FIG. 1 is obtained, as a matter of course.

<A-3. Modification 1>

In the active area 1B shown in FIG. 2, an unnecessary active area merely partially exists in the concave part. If the corner portion is provided with no concave part but obliquely notched, however, no effect may be attained even if the length of the gate end cap is increased as described above. In this case, the length of the gate end cap is further increased as described below.

Figure 3:
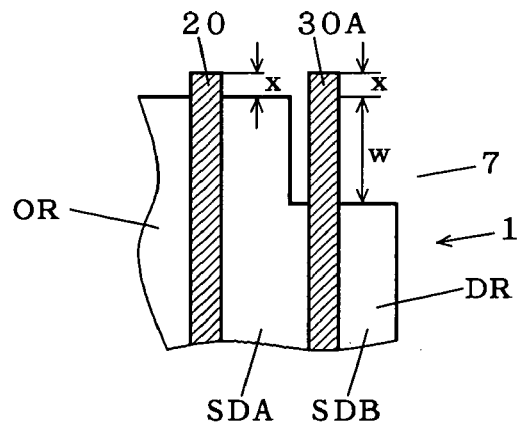
FIG. 3 illustrates a modification 1 of the semiconductor device according to the embodiment 1 of the present invention.

FIG. 3 shows a part of an active area 1 in the layout design phase of a modification 1 of the semiconductor device according to the embodiment 1 of the present invention and gate electrodes 20 and 30A arranged on this active area 1. Referring to FIG. 3, the gate electrode 30A is arranged on a depressed region DR having an edge portion which is located on a low position due to a concave part, and the gate electrode 20 is arranged on an ordinary region (region other than the depressed region) OR having an end portion projecting beyond the depressed region DR.

While a gate end cap of the gate electrode 20 has a length x, that of the gate electrode 30A has a length x+w. The additional length w is set to be equal to the depression length of the concave part, and endmost portions of the gate electrodes 20 and 30A are flush with each other as a result.

Figure 4:
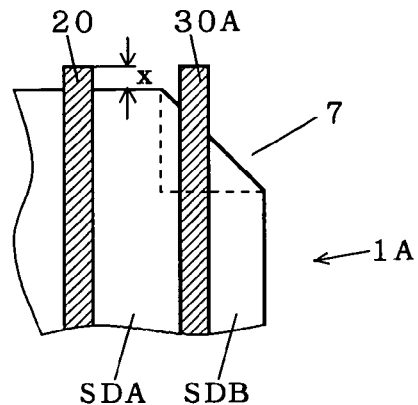
FIG. 4 illustrates the modification 1 of the semiconductor device according to the embodiment 1 of the present invention.

FIG. 4 shows a part of an active area 1A of a semiconductor device actually fabricated on the basis of such design values and gate electrodes 20 and 30A arranged on this active area 1A. Referring to FIG. 4, the active area 1A has a corner portion which is provided with no concave part but obliquely notched. A gate end cap of the gate electrode 30A is set at the length x+w described above on the active area 1A having such a shape, whereby an end portion of the gate electrode 30A completely reaches an upper portion of an insulating film 7. Thus, source/drain regions SDA and SDB provided on both sides of the gate electrode 30A are electrically isolated from each other and prevented from shorting, whereby the function of the MOS transistor can be maintained. If no problem arises in the fabrication process but the concave part is rectangularly shaped, a semiconductor device similar to that shown in FIG. 3 is obtained, as a matter of course.

<A-4. Modification 2>

While the length of the gate end cap of the gate electrode of the concave part is increased by the value equal to the depression length of the concave part in the aforementioned modification 1, the length of such a gate end cap may alternatively be decided as described below, in order to minimize the length.

Figure 5:
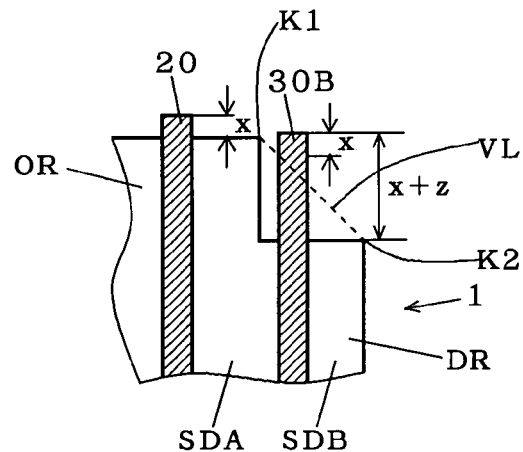
FIG. 5 illustrates a modification 2 of the semiconductor device according to the embodiment 1 of the present invention.

FIG. 5 shows a part of an active area 1 in the layout design phase of a modification 2 of the semiconductor device according to the embodiment 1 of the present invention and gate electrodes 20 and 30B arranged on this active area 1. Referring to FIG. 5, the gate electrode 30B is arranged on a depressed region DR having an edge portion which is located on a low position due to a concave part, while the gate electrode 20 is arranged on an ordinary region (region other than the depressed region) OR having an end portion projecting beyond the depressed region DR.

While a gate end cap of the gate electrode 20 has a length x, that of the gate electrode 30B has a length x+z. On the assumption that the corner portion of the active area 1 is provided with no concave part but obliquely notched, the additional length z is equalized with the length of a portion between an edge portion of the depressed region DR and a position where a virtual line VL connecting two convex corner portions K1 and K2 of the concave part of the active area 1 intersects with the gate electrode 30B, i.e., a position where the virtual line VL intersects with a longer side closer to the ordinary region OR in two longer sides of the gate end cap. The position where the virtual line VL intersects with the gate electrode 30B may be defined as that where the virtual line VL intersects with the center line of the gate electrode 30B or with a longer side closer to the ordinary region OR in two longer sides of the gate electrode 30B.

Figure 6:
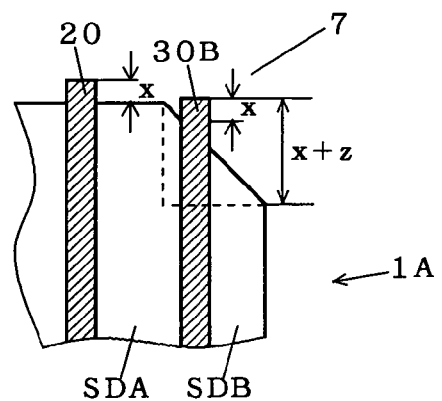
FIG. 6 illustrates the modification 2 of the semiconductor device according to the embodiment 1 of the present invention.

FIG. 6 shows a part of an active area 1A of a semiconductor device actually fabricated on the basis of such design values and gate electrodes 20 and 30B arranged on this active area 1A. Referring to FIG. 6, the active area 1A has a corner portion which is provided with no concave part but obliquely notched. A gate end cap of the gate electrode 30B is set at the length x+z as described above on the active area 1A having such a shape, whereby an end portion of the gate electrode 30B completely reaches an upper portion of an insulating film 7. Thus, source/drain regions SDA and SDB provided on both sides of the gate electrode 30B are electrically isolated from each other and prevented from shorting, whereby the function of the MOS transistor can be maintained. If no problem arises in the fabrication process but the concave part is rectangularly shaped, a semiconductor device similar to that shown in FIG. 5 is obtained, as a matter of course.

In each of the semiconductor devices according to the embodiment 1 of the present invention and the modifications 1 and 2, only a single gate electrode is arranged on the depressed region and the length of its gate end cap is increased. If a plurality of gate electrodes are arranged on such a depressed region, the gate end cap of only the innermost gate electrode must be increased in length.

Figure 7:
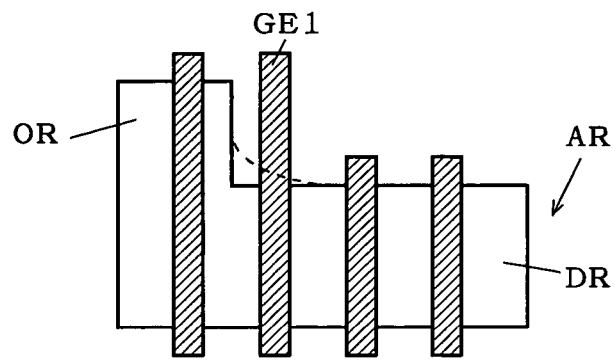
FIG. 7 illustrates still another modification of the semiconductor device according to the embodiment 1 of the present invention.

FIG. 7 shows such a structure. Referring to FIG. 7, an active area AR has such a wide depressed region DR that a plurality of gate electrodes are arranged thereon. In this case, the length of a gate end cap is increased only in a gate electrode GE1 which is most approximate to an ordinary region OR. Since an unnecessary active area is generally formed in the vicinity of a side wall of a concave part as shown by a broken line, and hence the present invention is sufficiently applied to a gate electrode which is in the vicinity of the side wall.

B. Embodiment 2

<B-1. Device Structure>

Figure 8:
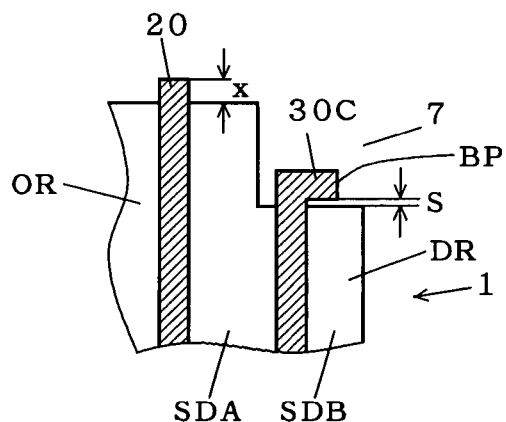
FIG. 8 illustrates a semiconductor device according to an embodiment 2 of the present invention.

FIG. 8 illustrates a part of an active area 1 in the layout design phase of a semiconductor device according to an embodiment 2 of the present invention and gate electrodes 20 and 30C arranged on this active area 1. Referring to FIG. 8, the active area 1 is provided with a concave part on its corner portion in a shape along a plan view. The gate electrode 30C is arranged on a depressed region DR having an edge portion which is located on a low position due to the concave part, and the gate electrode 20 is arranged on an ordinary region (region other than the depressed region) OR having an edge portion projecting beyond the depressed region DR. An insulating film 7 encloses the active area 1.

A gate end cap of the gate electrode 30C has a bent portion BP which is bent at an angle of about 90°, to extend oppositely to the ordinary region OR. This gate electrode 30C is so arranged as to maintain the distance between the bent portion BP and a horizontal edge portion (first edge portion) of the depressed region DR at a prescribed length s. The prescribed length s may be so set that the gate end cap is slightly in contact with or not in contact with the depressed region DR in plan view. The length of the bent portion BP may be substantially equal to the length x of a gate end cap of the gate electrode 20 arranged on the ordinary region OR.

<B-2. Characteristic Function/Effect>

Figure 9:
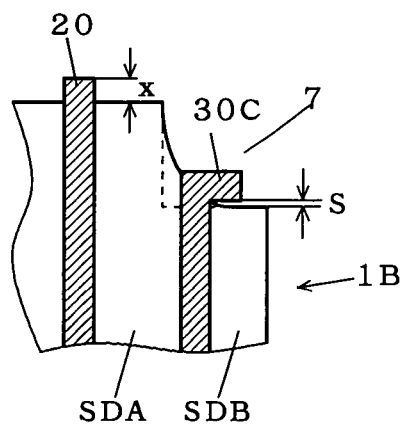
FIG. 9 illustrates the semiconductor device according to the embodiment 2 of the present invention.

FIG. 9 shows a part of an active area 1B of a semiconductor device actually fabricated on the basis of such design values and gate electrodes 20 and 30C arranged on this active area 1B. Referring to FIG. 9, the active area 1B is provided on its corner portion with a concave part, which is not rectangularly shaped. A gate end cap of the gate electrode 30C is bent at an angle of about 90° oppositely to an ordinary region OR as described above on the active area 1B having such a shape, whereby an end portion of the gate electrode 30C completely reaches an upper portion of an insulating film 7 even if an unnecessary active area exists in the concave part of the active area 1B, thereby preventing partial reduction of the gate length. Thus, source/drain regions SDA and SDB provided on both sides of the gate electrode 30B are electrically isolated from each other and prevented from shorting, whereby the function of the MOS transistor can be maintained. If no problem arises in the fabrication process but the concave part is rectangularly shaped, a semiconductor device similar to that shown in FIG. 8 is obtained, as a matter of course.

<B-3. Modification 1>

In the active area 1B shown in FIG. 9, an unnecessary active area merely partially exists in the concave part. If the unnecessary active area has a large area or the corner portion is provided with no concave part but obliquely notched, however, no effect may be attained by bending the gate end cap at an angle of about 90° oppositely to the ordinary region so that the bent portion BP has a length substantially equal to the length x of the gate end cap of the gate electrode arranged on the ordinary region. In this case, the length of such a bent portion is further increased as described below.

Figure 10:
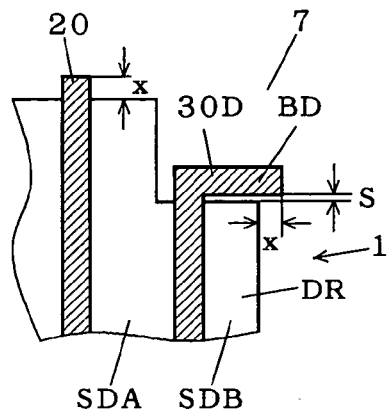
FIG. 10 illustrates a modification 1 the semiconductor device according to the embodiment 2 of the present invention.

FIG. 10 illustrates a part of an active area 1 in the layout design phase of a modification 1 of the semiconductor device according to the embodiment 2 of the present invention and gate electrodes 20 and 30D arranged on this active area 1. Referring to FIG. 10, the gate electrode 30D having a bent portion BD which is bent at an angle of about 90° oppositely to an ordinary region is so arranged on a depressed region DR that a forward end portion of the bent portion BD projects beyond a vertical edge portion (second edge portion) of the depressed region DR. The forward end portion of the bent portion BD of the gate electrode 30D projects beyond the vertical edge portion of the depressed region DR by a length substantially equal to the length x of a gate end cap of the gate electrode 20 arranged on the ordinary region.

Figure 11:
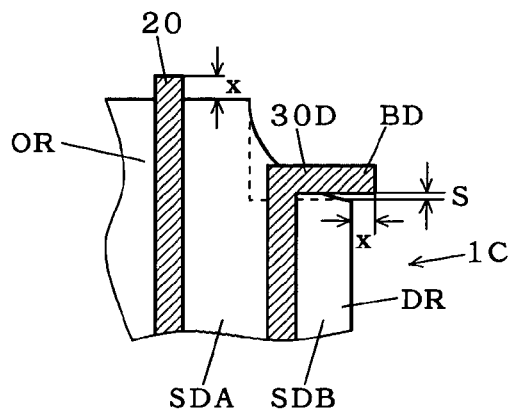
FIG. 11 illustrates the modification 1 of the semiconductor device according to the embodiment 2 of the present invention.

FIG. 11 shows a part of an active area 1C of a semiconductor device actually fabricated on the basis of such design values and gate electrodes 20 and 30D arranged on this active area 1C. Referring to FIG. 11, the active area 1C is provided on its corner portion with a concave part, which is not rectangularly shaped. While an unnecessary portion of the active area 1C has a larger area as compared with that of the active area 1B shown in FIG. 9, the gate electrode 30D is so formed that a forward end portion of its gate end cap projects beyond a vertical end portion of a depressed region DR by a length substantially equal to the length x, thereby preventing partial reduction of the gate length. Thus, source/drain regions SDA and SDB are prevented from occurrence of current leakage therebetween, whereby the function of the MOS transistor can be maintained. If no problem arises in the fabrication process but the concave part is rectangularly shaped, a semiconductor device similar to that shown in FIG. 10 is obtained, as a matter of course.

<B-4. Modification 2>

While the forward end portion having the bent portion which is bent oppositely to the ordinary region projects beyond the vertical edge portion of the depressed region by a length substantially equal to the length x of a gate end cap of the gate electrode arranged on the ordinary region in the aforementioned modification 1, the length of such a gate end cap may be decided in the following manner, in order to minimize the same.

Figure 12:
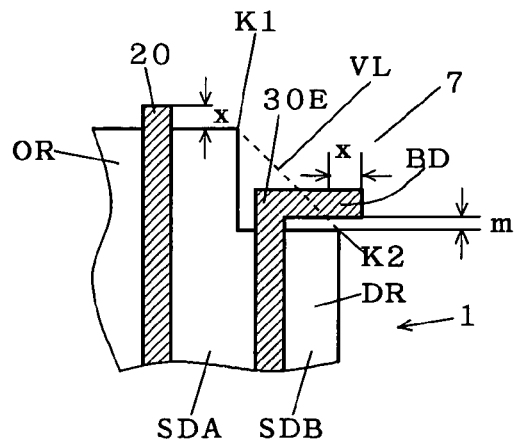
FIG. 12 illustrates a modification 2 of the semiconductor device according to the embodiment 2 of the present invention.

FIG. 12 illustrates a part of an active area 1 in the layout design phase of a modification 2 of the semiconductor device according to the embodiment 2 of the present invention and gate electrodes 20 and 30E arranged on this active area 1. Referring to FIG. 12, the gate electrode 30E having a bent portion BD which is bent at an angle of about 90° oppositely to an ordinary region OR is formed on a depressed region DR.

The gate electrode 30E is so arranged as to maintain the distance between the bent portion BD and a horizontal edge portion (first edge portion) of the depressed region DR at a prescribed length m. On the assumption that a corner portion of the active area 1 is provided with no concave part but obliquely notched, the gate electrode 30E is so formed as to project beyond a position where a virtual line VL connecting two convex corner portions K1 and K2 of the concave part of the active area 1 intersects with the bent portion BD, i.e., a position where the virtual line VL intersects with a longer side closer to the ordinary region OR in two longer sides of the bent portion BD, by a length substantially equal to the length x. Therefore, the length of the gate end cap can be reduced as compared with that of the gate electrode 30D described with reference to FIG. 10.

The position where the virtual line VL intersects with the gate electrode 30E may be defined as that where the virtual line VL intersects with the center line of the gate electrode 30E or with a longer side farther from the depressed region DR in two longer sides of the gate electrode 30E. A length m may be set in response to the virtual line VL. Namely, the length m may be reduced in case of setting the virtual line VL as connecting two points inside the two convex corner portions K1 and K2 of the concave part.

Figure 13:
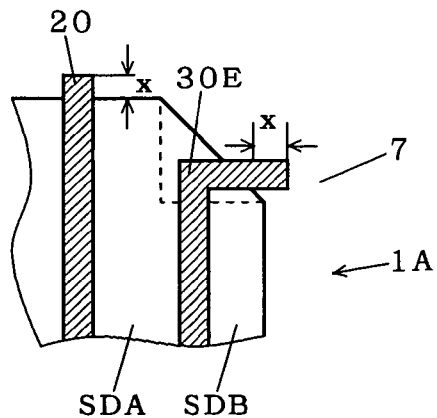
FIG. 13 illustrates the modification 2 of the semiconductor device according to the embodiment 2 of the present invention.

FIG. 13 shows a part of an active area 1A of a semiconductor device actually fabricated on the basis of such design values and gate electrodes 20 and 30E arranged on this active area 1A. Referring to FIG. 13, the active area 1A has a corner portion which is provided with no concave part but obliquely notched. A gate end cap of the gate electrode 30E is so formed as to project beyond the notched part of the active area 1A by a length substantially equal to the length x on the active area 1A having such a shape, whereby an end portion of the gate electrode 30A completely reaches an upper portion of an insulating film 7. Thus, source/drain regions SDA and SDB provided on both sides of the gate electrode 30E are electrically isolated from each other and prevented from shorting, whereby the function of the MOS transistor can be maintained. If no problem arises in the fabrication process but the concave part is rectangularly shaped, a semiconductor device similar to that shown in FIG. 12 is obtained, as a matter of course.

<B-5. Modification 3>

While the gate electrode has the bent portion which is bent oppositely to the ordinary region in each of the aforementioned semiconductor devices according to the embodiment 2 and the modifications 1 and 2, the angle for bending the gate end cap is not restricted to 90°.

Figure 14:
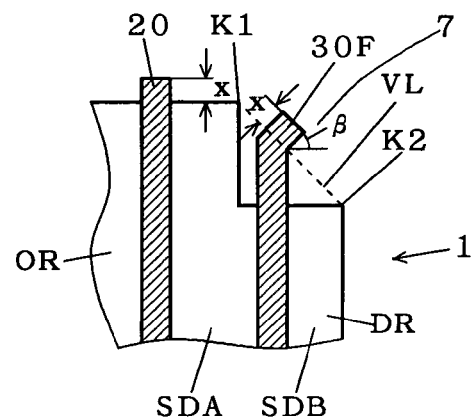
FIG. 14 illustrates a modification 3 of the semiconductor device according to the embodiment 2 of the present invention.

FIG. 14 illustrates a part of an active area 1 in the layout design phase of a modification 3 of the semiconductor device according to the embodiment 2 of the present invention and gate electrodes 20 and 30F arranged on this active area 1. Referring to FIG. 14, the gate electrode 30F has a bent portion which is bent at an angle $\beta(0°<\beta<90°)$ smaller than 90° in a direction separating from an ordinary region OR.

On the assumption that a corner portion of the active area 1 is provided with no concave part but obliquely notched, the gate electrode 30F is bent at the angle $\beta$ about a position where a virtual line VL connecting two convex corner portions K1 and K2 of the concave part of the active area 1 intersects with the bent portion, i.e., a position where the virtual line VL intersects with a longer side closer to a depressed region DR in two longer sides of the bent portion. The bent portion is so formed as to project beyond the bend center (the intersection between the virtual line VL and the bent portion) by a length substantially equal to the length x.

The position where the virtual line VL intersects with the gate electrode 30F may be defined as that where the virtual line VL intersects with the center line of the gate electrode 30F or with a longer side farther from the depressed region DR in two longer sides of the gate electrode 30F.

Figure 15:
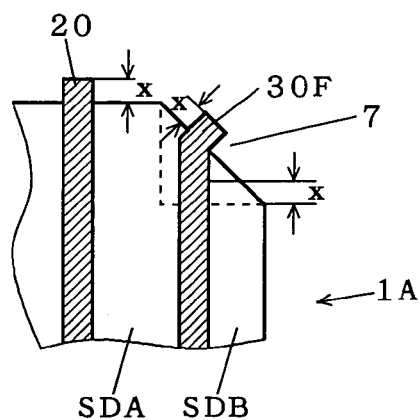
FIG. 15 illustrates the modification 3 of the semiconductor device according to the embodiment 2 of the present invention.

FIG. 15 shows a part of an active area 1A of a semiconductor device actually fabricated on the basis of such design values and gate electrodes 20 and 30F arranged on this active area 1A. Referring to FIG. 15, the active area 1A has a corner portion which is provided with no concave part but obliquely notched. A gate end cap of the gate electrode 30F is so formed as to project beyond the notched part of the active area 1A by a length substantially equal to the length x on the active area 1A having such a shape, whereby an end portion of the gate electrode 30F completely reaches an upper portion of an insulating film 7. Thus, source/drain regions SDA and SDB provided on both sides of the gate electrode 30F are electrically isolated from each other and prevented from shorting, whereby the function of the MOS transistor can be maintained. If no problem arises in the fabrication process but the concave part is rectangularly shaped, a semiconductor device similar to that shown in FIG. 14 is obtained, as a matter of course.

C. Embodiment 3

<C-1. Device Structure>

While only a single gate electrode is positioned on the concave part of the active area in each of the aforementioned semiconductor devices according to the embodiments 1 and 2 of the present invention, a plurality of gate electrodes may be formed on a concave part of an active area.

Figure 16:
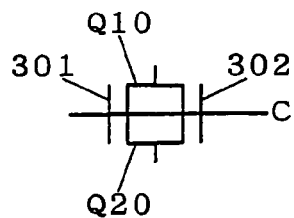
FIG. 16 illustrates a semiconductor device according to an embodiment 3 of the present invention.

FIG. 16 illustrates NMOS transistors Q10 and Q20 which are connected in parallel with each other. Referring to FIG. 16, drain electrodes as well as source electrodes of the NMOS transistors Q10 and Q20 are connected in common, while gate electrodes 301 and 302 thereof are connected to a common input part C.

Figure 17:
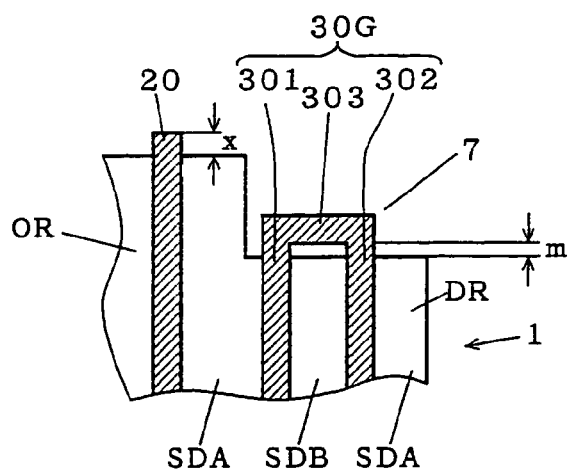
FIG. 17 illustrates the semiconductor device according to the embodiment 3 of the present invention.

FIG. 17 shows a part of an active area 1 in the layout design phase of a semiconductor device according to an embodiment 3 of the present invention and gate electrodes 20 and 30G arranged on this active area 1. Referring to FIG. 17, the active area 1 has a concave part on its corner portion in a shape along a plan view. An insulating film 7 encloses the active area 1. The gate electrode 30G is arranged on a depressed region DR having an edge portion which is located on a low position due to the concave part, and the gate electrode 20 is arranged on an ordinary region (region other than the depressed region) OR having an end portion projecting beyond the depressed region DR.

The gate electrode 30G is formed by gate electrodes 301 and 302 arranged on this depressed region DR successively from a side closer to the ordinary region OR and a connecting member 303 connecting gate end caps thereof with each other, to be U-shaped along a plan view. The gate electrode 30G is so arranged as to maintain the distance between the connecting member 303 and a horizontal edge portion of the depressed region DR at a prescribed length m (m: at least zero).

<C-2. Characteristic Function/Effect>

Figure 18:
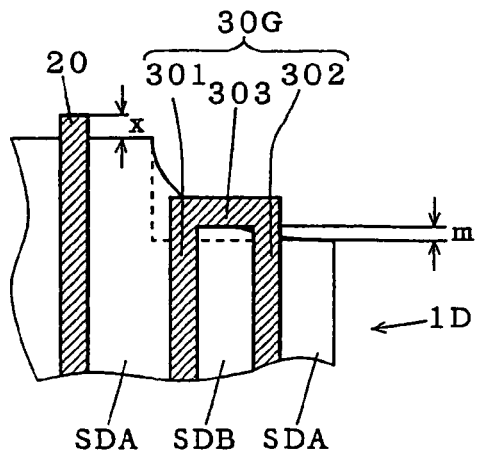
FIG. 18 illustrates the semiconductor device according to the embodiment 3 of the present invention.

FIG. 18 shows a part of an active area ID of a semiconductor device actually fabricated on the basis of such design values and gate electrodes 20 and 30G arranged on this active area ID. Referring to FIG. 18, the active area ID is provided on its corner portion with a concave part, which is not rectangularly shaped. A gate end cap of the gate electrode 30G connects those of gate electrodes 301 and 302 with each other as described above on the active area ID having such a shape. Even if an unnecessary active area exists in the concave part of the active area ID, therefore, the gate electrodes 301 and 302 and a connecting member 303 enclose a source/drain region SDB for isolating the same from a source/drain region SDA located in the exterior of the gate electrodes 301 and 302 and preventing the same from shorting, whereby the function of the MOS transistor can be maintained. If no problem arises in the fabrication process but the concave part is rectangularly shaped, a semiconductor device similar to that shown in FIG. 17 is obtained, as a matter of course.

<C-3. Modification>

While two gate electrodes, i.e., two transistors are formed on the concave part of the active area in the aforementioned semiconductor device according to the embodiment 3 of the present invention, two or more gate electrodes may be formed on a concave part of such an active area.

Figure 19:
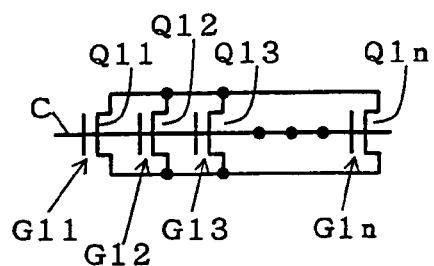
FIG. 19 illustrates a modification of the semiconductor device according to the embodiment 3 of the present invention.

FIG. 19 shows NMOS transistors Q11 to Q1n which are connected in parallel with each other in a modification of the semiconductor device according to the embodiment 3 of the present invention. Referring to FIG. 19, drain electrodes as well as source electrodes of the NMOS transistors Q11 to Q1n are connected in common, while gate electrodes G11 to Gin of the NMOS transistors Q11 to Q1n are connected to a common input part C.

Figure 20:
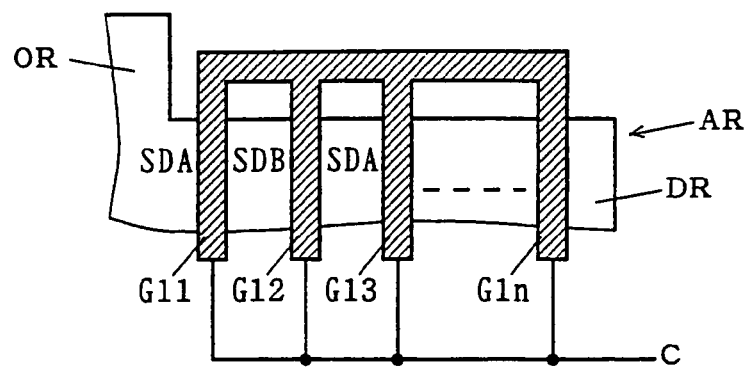
FIG. 20 illustrates the modification of the semiconductor device according to the embodiment 3 of the present invention.

FIG. 20 shows such a parallel connected body of the NMOS transistors Q11 to Q1n, which is formed on a depressed region DR. Referring to FIG. 20, the gate electrodes G11 to G1n are arranged on a concave part of an active area AR successively from a side closer to an ordinary region OR. All gate end caps of the gate electrodes G11 to G1n are connected in common.

When a plurality of gate electrodes arranged on a depressed region are electrically connected in common and gate end caps thereof are also connected in common, the gate electrodes enclose source/drain regions for electrically isolating the same from each other and preventing adjacent ones of the source/drain regions from shorting even if an unnecessary region is present in a concave part of an active area over a wide range, whereby functions of MOS transistors can be maintained.

When two or more gate electrodes are formed on a depressed region, not all gate end caps of the gate electrodes may be connected in common, dissimilarly to the above.

Figure 21:
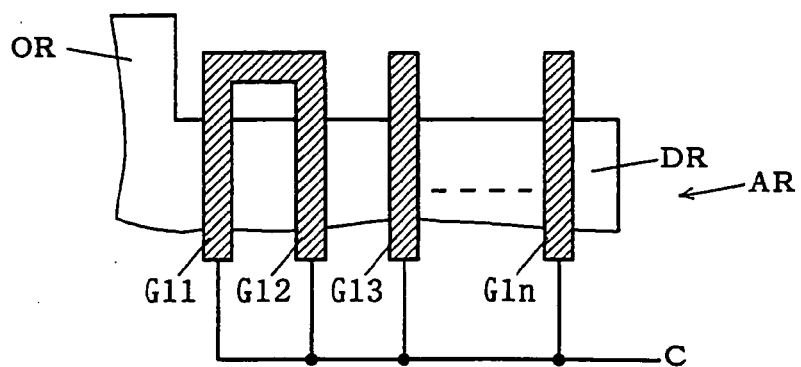
FIG. 21 illustrates the modification of the semiconductor device according to the embodiment 3 of the present invention.

As shown in FIG. 21, only gate end caps of a gate electrode G11 which is most approximate to an ordinary region OR and a gate electrode G12 adjacent thereto may be connected in common. The present invention is sufficiently applied to gate electrodes which are approximate to an ordinary region, since an unnecessary active area is generally formed in the vicinity of the ordinary region.

D. Embodiment 4

<D-1. Device Structure>

While the corner portion of the active area is provided with the concave part in each of the aforementioned semiconductor devices according to the embodiments 1 to 3 of the present invention, such a concave part may be formed on a portion other than the corner portion.

Figure 22:
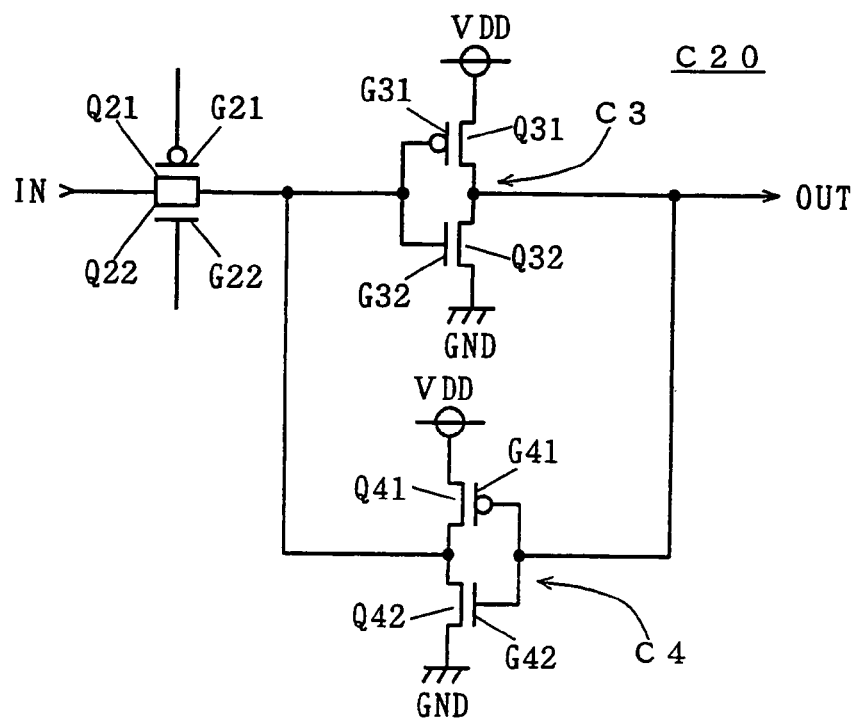
FIG. 22 illustrates a semiconductor device according to an embodiment 4 of the present invention.

In relation to a concave part formed on a portion other than the corner portion of an active area, FIG. 22 shows a ratio latch circuit C20, for example. Referring to FIG. 22, an input end of an inverter circuit C3 which is formed by a PMOS transistor Q31 and an NMOS transistor Q32 is connected to an output end of a transmission gate which is formed by a PMOS transistor Q21 and an NMOS transistor Q22, and an output end of the inverter circuit C3 defines that of the ratio latch circuit C20. An input end of an invertor circuit C4 which is formed by a PMOS transistor Q41 and an NMOS transistor Q42 is connected to the output end of the inverter circuit C3, and an output end of the inverter circuit C4 is connected to the input end of the inverter circuit C3. The PMOS and NOS transistors Q21, Q22, Q31, Q32, Q41 and Q42 have gate electrodes G21, G22, G31, G32, G41 and G42 respectively.

Figure 23:
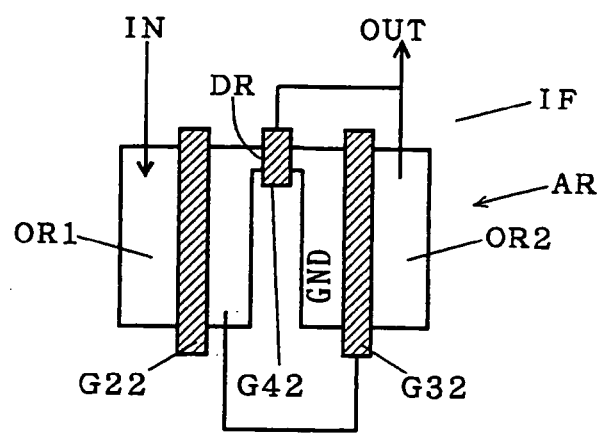
FIG. 23 illustrates the semiconductor device according to the embodiment 4 of the present invention.

FIG. 23 is a layout diagram of the NMOS transistors Q22, Q32 and Q42 of the ratio latch circuit C20 having the aforementioned structure.

Referring to FIG. 23, an active area AR has a concave part on its center in a shape along a plan view. The gate electrode G42 is arranged on a depressed region DR having a span which is reduced due to the concave part, and the gate electrodes G22 and G23 are arranged on ordinary regions (regions other than the depressed region DR) OR1 and OR2, which are larger in span than the depressed region DR, provided on both sides of the depressed region DR. An insulating film IF encloses the active area AR.

Figure 24:
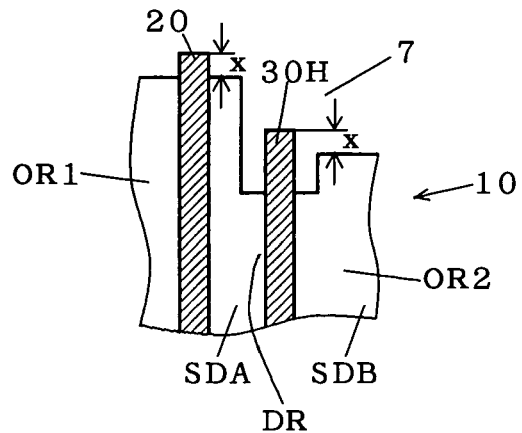
FIG. 24 illustrates the semiconductor device according to the embodiment 4 of the present invention.

While an unnecessary active area may be formed on a concave part provided on a portion other than the corner portion of an active area, functional loss of a MOS transistor resulting from the presence of the unnecessary active area can be prevented by the following structure:

FIG. 24 shows a part of an active area 10 in the layout design phase of a modification of the semiconductor device according to the embodiment 4 of the present invention and gate electrodes 20 and 30H arranged on this active area 10. Referring to FIG. 24, the active area 10 has a concave part in a portion other than the corner portion in a shape along a plan view. An insulating film 7 encloses the active area 10. In this case, the concave part may alternatively be referred to as a dent part.

The gate electrode 30H is arranged on a depressed region DR having an edge portion which is located on a low position due to the concave part. Ordinary regions (regions other than the depressed region) OR1 and OR2 (first and second ordinary regions) having edge portions projecting beyond the depressed region DR are provided on both sides of the depressed region DR. The gate electrode 20 is arranged on the ordinary region OR1. A gate end cap of the gate electrode 20 has a length x.

An end portion of the ordinary region OR2 is located on a position depressed from that of an end portion of the ordinary region OR1, to result in difference between the depression lengths of the ordinary regions OR1 and OR2. A gate end cap of the gate electrode 30H is formed to project beyond an edge portion of the ordinary region OR2 by a length substantially equal to the length x of the gate end cap of the gate electrode 20 arranged on the ordinary region OR1.

<D-2. Characteristic Function/Effect>

Figure 25:
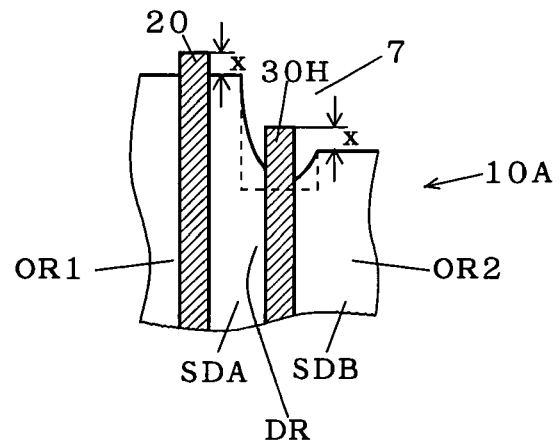
FIG. 25 illustrates the semiconductor device according to the embodiment 4 of the present invention.

FIG. 25 shows a part of an active area 10A of a semiconductor device actually fabricated on the basis of such design values and gate electrodes 20 and 30H arranged on this active area 10A. Referring to FIG. 25, the active area 10A has a concave part which is not rectangularly shaped. A gate end cap of the gate electrode 30H is formed to project beyond an edge portion of an ordinary region OR2 by a length substantially equal to the length x of a gate end cap of the gate electrode 20 arranged on an ordinary region OR1 in the active area 10A having such a shape, whereby an end portion of the gate electrode 30H completely reaches an upper portion of an insulating film 7 even if an unnecessary active area exists in the concave part of the active area 10A, thereby preventing the gate electrode 30H from partial reduction of its gate length. Thus, occurrence of current leakage between source/drain regions SDA and SDB can be prevented, whereby the function of the MOS transistor can be maintained. If no problem arises in the fabrication process but no unnecessary region exists in the concave part, a semiconductor device similar to that shown in FIG. 24 is obtained, as a matter of course.

<D-3. Modification 1>

Figure 26:
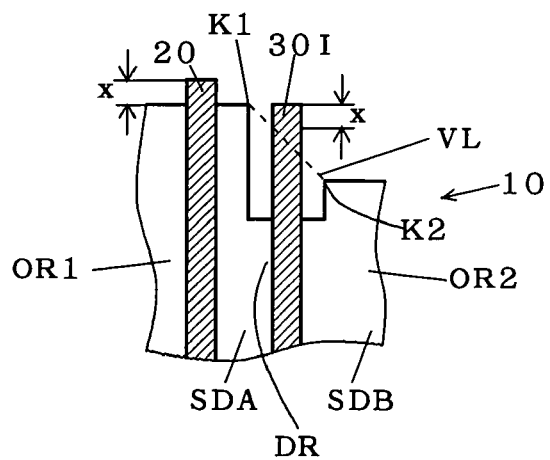
FIG. 26 illustrates a modification 1 of the semiconductor device according to the embodiment 4 of the present invention.

While the gate end cap of the gate electrode 30H is formed to project beyond the edge portion of the ordinary region OR2 by the length substantially equal to the length x of the gate end cap of the gate electrode 20 arranged on the ordinary region OR1 as hereinabove described in the aforementioned semiconductor device according to the embodiment 4, the length of such a gate end cap may alternatively set in the following manner:

FIG. 26 shows a part of an active area 10 in the layout design phase of a modification 1 of the semiconductor device according to the embodiment 4 of the present invention and gate electrodes 20 and 30I arranged on this active area 10. Referring to FIG. 26, the gate electrode 30I is arranged on a depressed region DR, and the gate electrode 20 is arranged on an ordinary region OR1.

A gate end cap of the gate electrode 20 has a length x, while a gate end cap of the gate electrode 30I is so formed as to project beyond a position where a virtual line VL connecting two convex corner portions K1 and K2 of the concave part of the active area 10 intersects with the gate electrode 30I, i.e., a position where the virtual line VL intersects with a longer side closer to the ordinary region OR1 in two longer sides of the gate end cap by a length substantially equal to the length x.

The position where the virtual line VL intersects with the gate electrode 30I may be defined as that where the virtual line VL intersects with the center line of the gate electrode 30I or with a longer side closer to the ordinary region OR2 in two longer sides of the gate electrode 30I.

Figure 27:
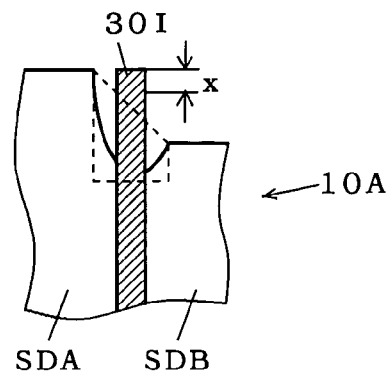
FIG. 27 illustrates the modification 1 of the semiconductor device according to the embodiment 4 of the present invention.

FIG. 27 shows a part of an active area 10A of a semiconductor device actually fabricated on the basis of such design values and a gate electrode 30I arranged on this active area 10A. Referring to FIG. 27, the active area 10A has a concave part which is not rectangularly shaped. A gate end cap of the gate electrode 30I is formed to project beyond an intersection between a virtual line VL and the gate electrode 30I by a length substantially equal to a length x, whereby an end portion of the gate electrode 30I completely reaches an upper portion of an insulating film 7 even if an unnecessary active area exists in the concave part of the active area 10A, thereby preventing the gate electrode 30I from partial reduction of its gate length. Thus, occurrence of current leakage between source/drain regions SDA and SDB can be prevented, whereby the function of the MOS transistor can be maintained. If no problem arises in the fabrication process and no unnecessary region exists in the concave part, a semiconductor device similar to that shown in FIG. 26 is obtained, as a matter of course.

<D-4. Modification 2>

While the ordinary regions OR1 and OR2 are different in depression length from each other in the aforementioned semiconductor device according to the embodiment 4 of the present invention, the length of a gate end cap may be set in the following manner if depression lengths on right and left sides of a concave part are identical to each other.

Figure 28:
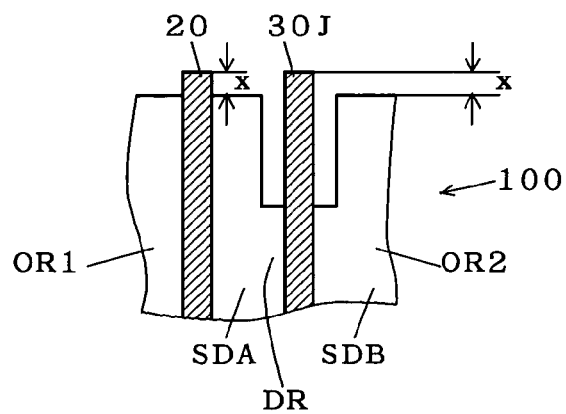
FIG. 28 illustrates a modification 2 of the semiconductor device according to the embodiment 4 of the present invention.
Figure 29:
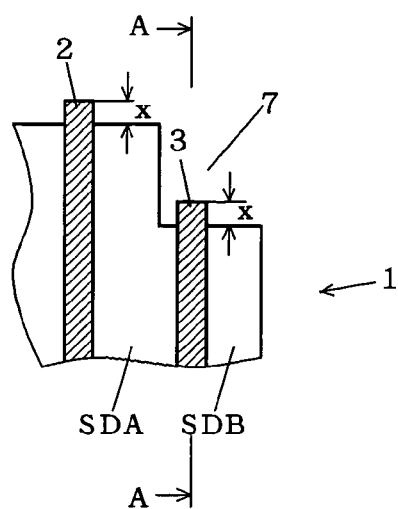
FIG. 29 illustrates a problem in a conventional semiconductor device.
Figure 30:
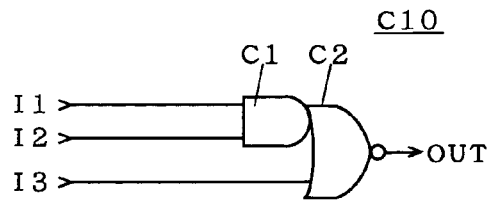
FIG. 30 illustrates an exemplary circuit having a concave part in an active area.
Figure 31:
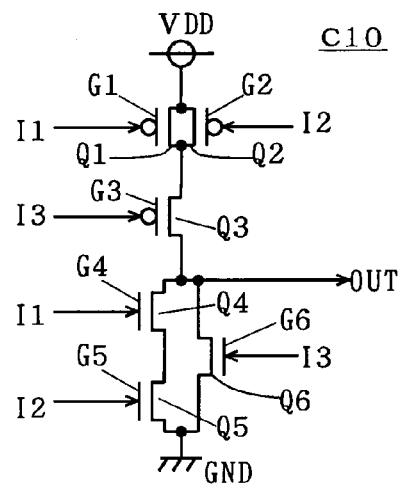
FIG. 31 illustrates the exemplary circuit having the concave part in the active area.
Figure 32:
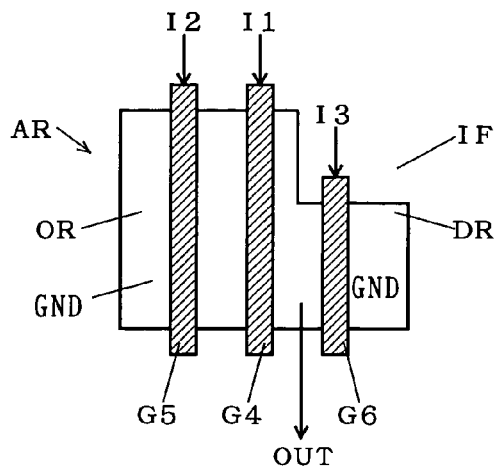
FIG. 32 illustrates the layout of the exemplary circuit having the concave part in the active area.
Figure 33:
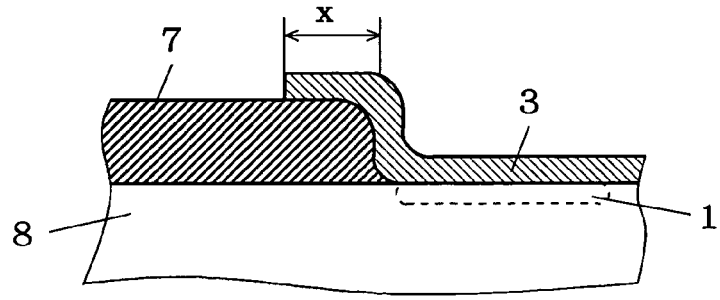
FIG. 33 illustrates a sectional structure of a general active area.
Figure 34:
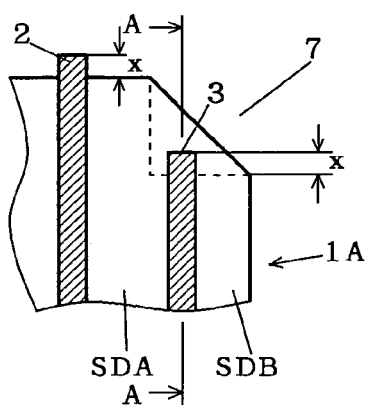
FIG. 34 illustrates the structure of a conventional semiconductor device.
Figure 35:
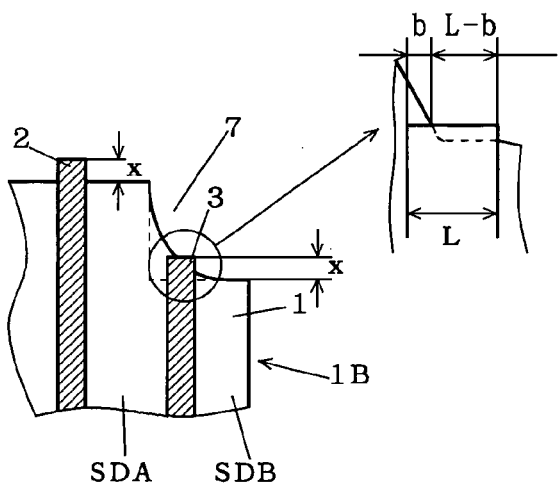
FIG. 35 illustrates the structure of another conventional semiconductor device.
Figure 36:
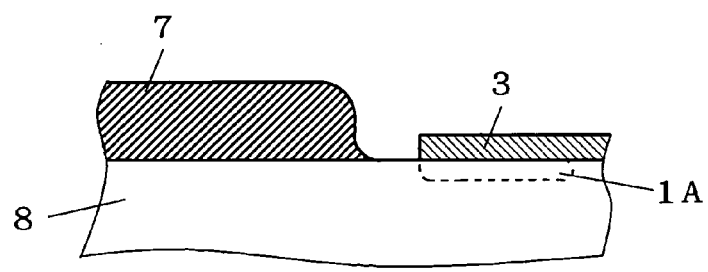
FIG. 36 illustrates a sectional structure of a depressed region of an active area.
Figure 37:
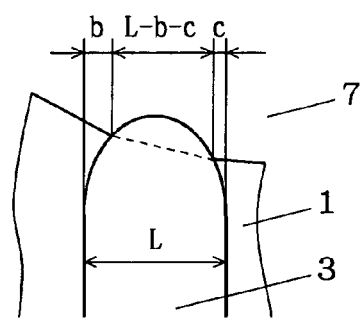
FIG. 37 illustrates the structure of still another conventional semiconductor device.

FIG. 28 shows a part of an active area 100 in the layout design phase of a modification 2 of the semiconductor device according to the embodiment 4 of the present invention and gate electrodes 20 and 30J arranged on this active area 100. The active area 100 shown in FIG. 28 is provided with depressed portions having the same length on right and left sides of a concave part. The gate electrode 30J is arranged on a depressed region DR having an edge portion which is located on a low position due to the concave part, and the gate electrode 20 is arranged on an ordinary region OR1.

A gate end cap of the gate electrode 30J is so formed as to project beyond an edge portion of the depressed region DR by a length substantially equal to the length x of a gate end cap of the gate electrode 20 arranged on the ordinary region OR1. Even if the concave part is filled up with an unnecessary active area to disappear, source/drain regions SDA and SDB provided on both sides of the gate electrode 30J are electrically isolated from each other and prevented from shorting due to the aforementioned structure, whereby the function of the MOS transistor can be maintained.

While the invention has been shown and described in detail, the following description is in all aspects illustrative and restrictive. It is therefore understood that numerous modifications and variations can be devised without departing from the scope of the invention.

We claim:

1. A semiconductor device comprising:
    an active area with at least one MOS transistor to be formed therein;
    an insulation film for defining said active area, said insulation film having a top surface; and
    a current/leakage prevention portion for preventing current leakage,
    said active area having a recess in plan configuration,
    said recess being defined by first, second and third edges,
    said first and second edges being parallel to each other, with said insulation film positioned therebetween,
    said third edge being connected to a first end of said first edge and first end of said second edge, said third edge extending in a direction perpendicular to a direction in which said first and second edges extend,
    said active area having a fourth edge connected to a second end opposite from said first end of said first edge, said fourth edge being parallel to said third edge, said fourth edge extending in a direction opposite from said second edge, and said active area having a fifth edge connected to a second end opposite from said first end of second edge, said fifth edge being parallel to said third edge and said fifth edge extending in a direction opposite from said first edge, said at least one MOS transistor including a first MOS transistor having a first gate electrode, and a second MOS transistor having a second gate electrode, said first gate electrode extending in a direction perpendicular to the direction in which said fourth edge extends, said second gate electrode extending in a direction perpendicular to the direction in which said third edge extends, and said first and second gate electrodes being parallel to one another and having a source/drain disposed therebetween, said current/leakage prevention portion including a first end of said first gate electrode extending beyond said fourth edge and extending over the top surface of said insulation film, a first end of said second gate electrode extending beyond said third edge and extending over the top surface of said insulation film, and said first gate electrode beyond said fourth edge being defined by having a first length from said fourth edge to said first end thereof, said second gate electrode beyond said third edge being defined by having a second length from said third edge to said first end thereof, the second length of said second gate electrode being greater than the first length of said first gate electrode and the second length having a first portion extending between the third edge to a virtual line of said fifth edge extended in a horizontal direction and a second portion of the second length of said second gate electrode, extending beyond the virtual line of said fifth edge to said first end thereof, the second portion being equal in length to said first length of said first gate electrode.

2. The semiconductor device according to claim 1, wherein said first edge is greater in length than said second edge, and said second length is greater than at least the length of said second edge.

3. The semiconductor device according to claim 2, wherein said second length is a sum of said first length and the length of said second edge.

4. A semiconductor device comprising:

an active area with at least one MOS transistor to be formed therein;

an insulation film for defining said active area, said insulation film having a top surface; and a current/leakage prevention portion for preventing current leakage, said active area having a recess in plan configuration, said recess being defined by first, second and third edges, said first and second edges being parallel to each other, with said insulation film positioned therebetween, said third edge being connected to a first end of said first edge and first end of said second edge, said third edge extending in a direction perpendicular to a direction in which said first and second edges extend, said active area having a fourth edge connected to a second end opposite from said first end of said first edge, said fourth edge being parallel to said third edge, said fourth edge extending in a direction opposite from said second edge, said at least one MOS transistor including a first MOS transistor having a first gate electrode, and a second MOS transistor having a second gate electrode, said first gate electrode extending in a direction perpendicular to the direction in which said fourth edge extends, said second gate electrode extending in a direction perpendicular to the direction in which said third edge extends, and said first and second gate electrodes being parallel to one another and having a source/drain disposed therebetween, said current/leakage prevention portion including a first end of said first gate electrode extending beyond said fourth edge and extending over the top surface of said insulation film, a first end of said second gate electrode extending beyond said third edge and extending over the top surface of said insulation film, and said first gate electrode beyond said fourth edge being defined by having a first length from said fourth edge to said first end thereof, said second gate electrode beyond said third edge being defined by having a second length from said third edge to said first end thereof, the second length of said second gate electrode being greater than the first length of said first gate electrode, wherein said second length is a sum of said first length and a length from said third edge to an intersection of said second gate electrode and an imaginary line connecting said second end of said first edge and a second end of said second edge.

5. The semiconductor device according to claim 1, wherein said second length is greater than the lengths of said first and second edges.

6. The semiconductor device according to claim 5, wherein said first and second gate electrodes are parallel to each other, and said first end of said first gate electrode and said first end of said second gate electrode are in a line.

7. A method of manufacturing a semiconductor device including an active area with at least one MOS transistor to be formed therein, and an insulation film for defining said active area, based on layout design comprising the steps of:

(a) configuring said active area to have a recess in plan configuration; and (b) configuring a first MOS transistor having a first gate electrode and a second MOS transistor having a second gate electrode on said active area, and configuring said first and second gate electrodes to be parallel to one another and having a source/drain region disposed therebetween, said step (a) including the steps of configuring said recess to be defined by first, second and third edges, said first and second edges being parallel to each other, with said insulation film positioned therebetween, said third edge being connected to a first end of said first edge and a first end of said second edge, said third edge extending in a direction perpendicular to a direction in which said first and second edges extend, configuring a fourth edge connected to a second end opposite from said first end of said first edge, said fourth edge being parallel to said third edge, said fourth edge extending in a direction opposite from said second edge, and configuring a fifth edge connected to a second end opposite from said first end of said second edge, said fifth edge being parallel to said third edge, said fifth edge extending in a direction opposite from said first edge, said step (b) including the steps of configuring said first gate electrode to extend in a direction perpendicular to the direction in which said fourth edge extends, and configuring said second gate electrode to extend in a direction perpendicular to the direction in which said third edge extends, and configuring a current/leakage prevention portion to prevent current leakage by configuring said first gate electrode to have a first end extend beyond said fourth edge and extend over a top surface of said insulation film and configuring said second gate electrode to have a first end extend beyond said third edge and extend over the top surface of said insulation film, said first gate electrode beyond said fourth edge being defined by having a first length from said fourth edge to said first end thereof, said second gate electrode beyond said third edge being defined by having a second length from said third edge to said first end thereof, the second length of said second gate electrode being greater than the first length of said first gate electrode, and the second length having first and second portions, the first portion extending between the third edge and a virtual line of the fifth edge extended in a horizontal direction, the second portion extending beyond the virtual line of the fifth edge to the first end thereof, the second portion being equal in length to the first length of the first gate electrode.

8. The method according to claim 7, wherein said step (a) includes configuring said first edge to be greater in length than said second edge, and said step (b) includes configuring said second length to be greater than at least the length of said second edge.

9. The method according to claim 8, wherein said step (b) includes configuring said second length to equal a sum of said first length and the length of said second edge.

10. A method of manufacturing a semiconductor device including an active area with at least one MOS transistor to be formed therein, and an insulation film for defining said active area, based on layout design comprising the steps of:

(a) configuring said active area to have a recess in plan configuration; and (b) configuring a first MOS transistor having a first gate electrode and a second MOS transistor having a second gate electrode on said active area, and configuring said first and second gate electrodes to be parallel to one another and having a source/drain region disposed therebetween, said step (a) including the steps of configuring said recess to be defined by first, second and third edges, said first and second edges being parallel to each other, with said insulation film positioned therebetween, said third edge being connected to a first end of said first edge and a first end of said second edge, said third edge extending in a direction perpendicular to a direction in which said first and second edges extend, and configuring a fourth edge connected to a second end opposite from said first end of said first edge, said fourth edge being parallel to said third edge, said fourth edge extending in a direction opposite from said second edge, said step (b) including the steps of configuring said first gate electrode to extend in a direction perpendicular to the direction in which said fourth edge extends, and configuring said second gate electrode to extend in a direction perpendicular to the direction in which said third edge extends, and configuring a current/leakage prevention portion to prevent current leakage by configuring said first gate electrode to have a first end extend beyond said fourth edge and extend over a top surface of said insulation film and configuring said second gate electrode to have a first end extend beyond said third edge and extend over the top surface of said insulation film, said first sate electrode beyond said fourth edge being defined by having a first length from said fourth edge to said first end thereof, said second gate electrode beyond said third edge being defined by having a second length from said third edge to said first end thereof, the second length of said second gate electrode being greater than the first length of said first gate electrode, wherein said step (b) includes configuring said second length to equal a sum of said first length and a length from said third edge to an intersection of said second gate electrode and an imaginary line connecting said second end of said first edge and a second end of said second edge.

11. The method according to claim 7, wherein said step (b) includes configuring said second length to be greater than the lengths of said first and second edges.

12. The method according to claim 11, wherein said step (b) includes configuring said first end of said first gate electrode and said first end of said second gate electrode to be in a line.

* * * * *